(12) United States Patent
Kobayashi

(10) Patent No.: US 6,738,681 B2
(45) Date of Patent: May 18, 2004

(54) METHOD FOR MANUFACTURING SEMICONDUCTOR DEVICE, SEMICONDUCTOR MANUFACTURING APPARATUS, AND METHOD FOR CONTROLLING TRANSFER IN PRODUCTION LINE

(75) Inventor: Yoshiaki Kobayashi, Tsuchiura (JP)

(73) Assignee: Trecenti Technologies, Inc., Ibaraki (JP)

( * ) Notice: Subject to any disclaimer, the term of this patent is extended or adjusted under 35 U.S.C. 154(b) by 0 days.

(21) Appl. No.: 10/359,086

(22) Filed: Feb. 6, 2003

(65) Prior Publication Data

US 2003/0204280 A1 Oct. 30, 2003

(30) Foreign Application Priority Data

Apr. 26, 2002 (JP) ........................................ 2002-126000

(51) Int. Cl.[7] ............................ G06F 19/00; G05B 19/418
(52) U.S. Cl. .......................... 700/99; 700/95; 700/100; 700/112; 700/121; 705/8
(58) Field of Search ................................ 700/90, 95, 97, 700/99, 100, 112, 117, 121; 705/8

(56) References Cited

U.S. PATENT DOCUMENTS 5,706,200 A * 1/1998 Kumar et al. ............... 700/100
6,131,052 A * 10/2000 Ban et al. .................... 700/121
6,490,494 B1 * 12/2002 Yasuda ........................ 700/101

FOREIGN PATENT DOCUMENTS

JP    2001-325013    11/2001

* cited by examiner

Primary Examiner—Jayprakash N. Gandhi
(74) Attorney, Agent, or Firm—Mattingly, Stanger & Malur, P.C.

(57) ABSTRACT

Shortening TAT for processing express lots without reducing the utilization rate of manufacturing apparatuses for semiconductor device. When the number of vacant ports LPOT of a manufacturing apparatus EQ3 used in a next step is only one at the of time of completing a process for a normal lot LA by a manufacturing apparatus EQ1 and when there is a possibility that processes for an express lot LB performed by a manufacturing apparatus EQ2 will be completed before a remaining processing time period for a lot LC performed by the manufacturing apparatus EQ3 reaches a predetermined set value, the lot LA is transferred to a lot stocker LS for securing a vacant port LPOT and as soon as the processes for the express lot LB performed by the manufacturing apparatus EQ2 are completed, the express lot LB is transferred to the vacant port LPOT in the manufacturing apparatus EQ3.

15 Claims, 13 Drawing Sheets

LOT FLOW

LOT FLOW

LOT FLOW

METHOD FOR MANUFACTURING SEMICONDUCTOR DEVICE, SEMICONDUCTOR MANUFACTURING APPARATUS, AND METHOD FOR CONTROLLING TRANSFER IN PRODUCTION LINE

BACKGROUND OF THE INVENTION

The present invention relates to a manufacturing technique of a semiconductor device and to a semiconductor manufacturing apparatus and a technique of controlling transfer in a production line. It particularly relates to a technique effectively applied to a method for manufacture-starting lots in a process for manufacturing the semiconductor device.

In the recent manufacture of semiconductor devices, it is required to rapidly supply products to meet the needs of customers, and necessities of manufacturing the products at short TAT (Turn Around Time) are increasing to cope with such needs. Further, since product cycles become shortened, the shortening of TAT for developments of semiconductor products is strongly necessitated. It is particularly necessary to repeatedly perform adjustment of a manufacturing process, correction of mask patterns, and the like in developmental stages of new products. Therefore, it is of importance to shorten the TAT for manufacturing samples to shorten the development period for products.

For example, Japanese Patent Laid-open No. 2001-325013 discloses a technique of: in the case of allotting manufacturing steps for lots of high priority (hereinafter referred to as "express lots") in a manufacturing process of normal lots, suppressing a decrease in an utilization rate of the entire semiconductor manufacturing line; and dissolving the manufacture holdup of the express lots to manufacture the expresses lots for the minimum period. More particularly, one or more than one manufacturing apparatus capable of being allotted to an express-lot process compares process-finish time of the lots that is presently being processed and process-start estimated time of the express lots. Then, the express lot is allotted to such manufacturing apparatus that the process-finish time of the presently processing lots precedes the process-start estimated time of the express lots and that the process-finish time of the presently processing lots is latest. If all the process-finish time of the lots that are presently being processed in all of the corresponding manufacturing apparatuses are later than the process-start estimated time of the express lot, to such manufacturing apparatus that the process-finish time of the presently processing lots is latest, the presently processing lots is not transferred in advance and the manufacturing apparatus is kept empty until the processing of the express lot is started.

SUMMARY OF THE INVENTION

In production lines for semiconductor device, not to reduce the utilization rate of the manufacturing apparatus by the occurrence of the time required for the lots to wait for being transferred in the manufacturing apparatus, when a port of the manufacturing apparatus becomes empty, a dispatch system for lot gives order, which takes priority and FIFO (First-In First-Out) into consideration, to the lots standby in a stocker. Based on the order, an appropriate lot is transferred to the vacant port. Considering such a technique, the inventors of the present invention have found that the following problems are present.

Namely, when a vacant port occurs in the manufacturing apparatus, the dispatch system for lot immediately allots the appropriate lot to this vacant port to transfer this lot to the vacant port, whereby there is a possibility that time required for transferring first the express lot to the manufacturing apparatus will be not obtained. For this reason, there have been problems of the fact that the timing, in which manufacture progress of the express lots exceeds manufacture progress of the normal lots, is reduced and that shortening of the TAT for processing the express lots becomes impossible.

Also, in a production line for semiconductor device, the production line may be of a complicated system or it is required to use repeatedly the same manufacturing apparatus. Therefore, for example, by making a Gantt chart for all the manufacturing apparatuses in the production line in advance, a schedule of manufacture-start plans is made in detail and the lots are transferred to the manufacturing apparatus in accordance with this schedule and then the manufacturing of the lots starts. Considering such a technique, the inventors of the present invention have found that the following problems are present.

That is, if there occurs a time lag between the actual manufacture-start and process-finish times and the schedule made in advance, the lot-transfer waiting time occurs in the manufacturing apparatus and the utilization rate of the manufacturing apparatus is reduced. Thereby, there has been a problem of a reduction in the yield of the semiconductor device.

Also, if an accidental abnormality in a manufacturing apparatus (for example, occurrence of foreign matters or the like) occurs, it is required to remake the detailed schedule of the manufacture-start plans of all the manufacturing apparatuses in the production line. If such accidental abnormality occurs continuously, rescheduling is frequently performed and a complicated system or the like is required to have a high-speed scheduling tool with high reliability and to grasp the current status of the production line and the cost thereof increases. Therefore, there has been a problem of the fact that the manufacturing cost of the semiconductor device is increased.

An object of the present invention is to provide a technique capable of shortening the TAT for processing the express lots, without reducing the utilization rate of a device for manufacturing a semiconductor device.

The above and other objects and novel features of the present invention will become apparent from the description of the present specification and the accompanying drawings.

Outlines of representative ones of the inventions disclosed in this application will be briefly described as follows.

More particularly, according to the present invention, a method for manufacturing a semiconductor device, which employs at least one first processing apparatus performing a first process to a lot, and at least one second processing apparatus having two or more than two ports and performing a second process to said lot, comprises the steps of:

(a) performing said first process to a first lot with a predetermined process priority by said first processing apparatus;

(b) performing said first process to a second lot lower in process priority than said first lot by said first processing apparatus;

(c) transferring said second lot to a first standby area when said step (b) is completed before said step (a) and only one of said ports is vacant in said second processing apparatus;

(d) transferring said first lot to the vacant port in said second processing apparatus after said step (a); and (e) performing said second process to said first lot by said second processing apparatus.

Further, according to the present invention, a method for manufacturing a semiconductor device, which employs at least one first processing apparatus performing a first process to a lot, and at least one second processing apparatus having two or more than two ports and performing a second process to said lot, comprises the steps of:

(a) performing said first process to a first lot having a predetermined process priority by said first processing apparatus;

(b) performing said first process to a second lot lower in process priority than said first lot by said first processing apparatus;

(c) transferring said second lot to said ports which are vacant in said second processing apparatus after said step (b);

(d) transferring said second lot to a first standby area from said second processing apparatus and transferring said first lot to said ports vacant in said second processing apparatus when said step (a) is completed during or after said step (c) and when said second process for said second lot by said second processing apparatus stats not being performed; and (e) performing said second process to said first lot by said second processing apparatus.

Further, according to the present invention, a semiconductor manufacturing apparatus comprises:

(a) at least one first processing apparatus performing a first process to a lot;

(b) a first standby area provided at a predetermined position;

(c) a second processing apparatus having two or more than two ports and performing a second process to said lot;

(d) a transfer apparatus transferring the lot to said first processing apparatus and said second processing apparatus; and (e) a control means controlling said first processing apparatus, said second processing apparatus and said transfer apparatus, wherein said control means controls said transfer apparatus such that:

(e1) in the presence of at least one vacant port in said second processing apparatus at the time of completing said first process for a first lot having a predetermined process priority by said first processing apparatus, transferring said first lot to said vacant port; and (e2) in the absence of two or more of said vacant ports in said second processing apparatus at the time of completing said first process to a second lot lower in process priority than said first lot by said first processing apparatus, transferring said second lot to said first standby area.

Further, according to the present invention, a semiconductor manufacturing apparatus comprises:

(a) at least one first processing apparatus performing a first process to a lot;

(b) a first standby area provided at a predetermined position;

(c) a second processing apparatus having two or more than two ports and performing a second process to said lot;

(d) a transfer apparatus transferring said lot to said first processing apparatus and said second processing apparatus; and (e) a control means controlling said first processing apparatus, said second processing apparatus and said transfer apparatus, wherein said control means controls said transfer apparatus such that:

(e1) at the time of completing said first process of a second lot lower in process priority than a first lot having a predetermined process priority by the first processing apparatus, said second lot is transferred to the ports vacant in said second processing apparatus; and (e2) when said first process of said first lot by the first processing apparatus is completed during or after the transfer of said second lot to the ports vacant in said second processing apparatus and when said second process for said second lot by said second processing apparatus starts not being performed, said second lot is transferred to a first standby area from said second processing apparatus and said first lot is transferred to said vacant port in said second processing apparatus.

DESCRIPTION OF THE PREFERRED EMBODIMENTS

Figure 1:
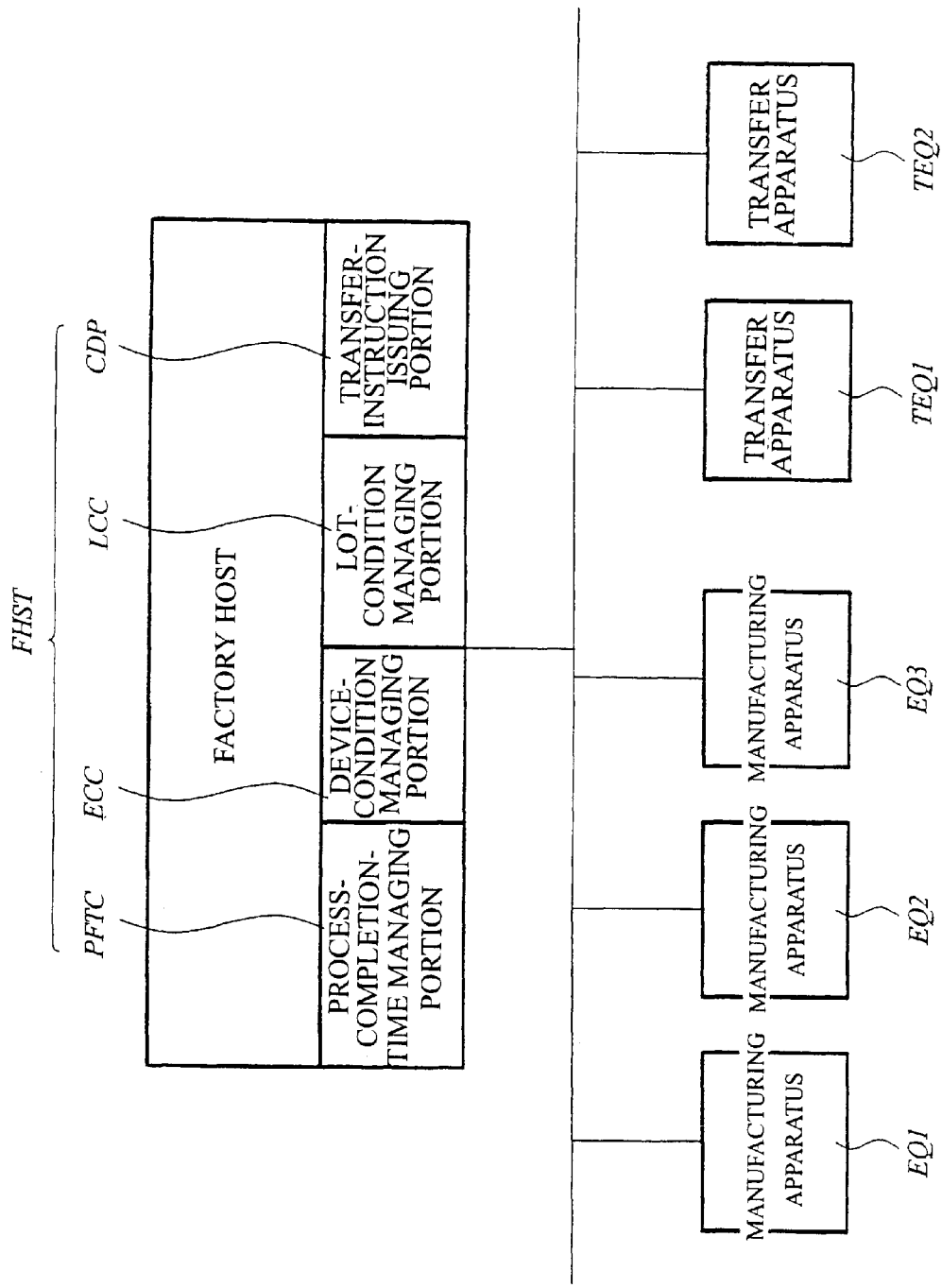
FIG. 1 is an explanatory view illustrating a structure of a production line for a semiconductor device, which is a first embodiment of the present invention.

Embodiments of the present invention will below be described in detail with reference to the drawings. Note that members having the same functions are given the same reference numerals through all of the drawings for describing the embodiments, and the repetitive descriptions thereof will be omitted.

(First Embodiment)

One example of a structure of a production line for semiconductor device, which is a first embodiment, will first be described with reference to FIG. 1. As illustrated in FIG. 1, for example, the production line for semiconductor device, which is the first embodiment, includes: manufacturing apparatuses EQ1, EQ2 and EQ3 for performing respective wafer processing step such as oxidation, diffusion, impurity injection, wiring pattern formation, insulating layer formation, and wiring layer formation with respect to a semiconductor wafer; transfer apparatuses TEQ1 and TEQ2 for transferring lots to respective manufacturing apparatuses; and the like. Operations of these manufacturing apparatuses and transfer apparatuses are managed and controlled by a factory host FHST. The factory host FHST includes, for example, a process-completion-time managing portion PFTC, a device-condition managing portion ECC, a lot-condition managing portion LCC, and a transfer-instruction issuing portion CDP, etc. The process-completion-time managing portion PFTC calculates respective times when processing of the respective lots by the manufacturing apparatuses EQ1, EQ2 and EQ3 are completed, and manages the times, and reports the times and time periods remaining up to the times, to the factory host FHST. The device-condition managing portion ECC manages the conditions and the operating statuses of the manufacturing apparatuses EQ1, EQ2 and EQ3 and the transfer apparatuses TEQ1 and TEQ2, etc. and, in the presence of any changes in the conditions and the operating statuses thereof, sequentially informs the factory host FHST of the changes. The lot-condition managing portion LCC: manages the conditions of the lots subjected to respective processes in the production line for semiconductor device according to the first embodiment, thereby grasping and the like step progression of the lots and the manufacturing apparatus to which the lots are transferred; and reports information on them to the factory host FHST as occasion demands. The transfer-instruction issuing portion CDP issues instructions to transfer the lots to the transfer apparatuses TEQ1 and TEQ2, in accordance with the instructions of the factory host FHST that has received the information from each of the process-completion time managing portion PFTC, the device-condition managing portion ECC and the lot-condition managing portion LCC.

Next, processing steps of the lots used in the production line for semiconductor device according to the above first embodiment will be described with reference to FIGS. 2 to 4. In the production line for semiconductor device according to the above first embodiment, a lot that is subjected to a specified process (first process) at the manufacturing apparatus (first processing apparatus) EQ1 or the manufacturing apparatus (second processing apparatus) EQ2 is subjected to another specified process (second process) at the manufacturing apparatus (second processing apparatus) EQ3 in a following step. Also, in the first embodiment, the case where each of the manufacturing apparatuses EQ1, EQ2 and EQ3 has a plurality of apparatuses will be described as an example. However, in the present invention, each of the manufacturing apparatuses EQ1, EQ2 and EQ3 may have just one apparatus. Further, lots including both of products of high priority and other products are treated as express lots in the first embodiment.

In the following description, the gathering of apparatuses for performing processes of the same type will be expressed as a group of apparatuses.

Figure 2:
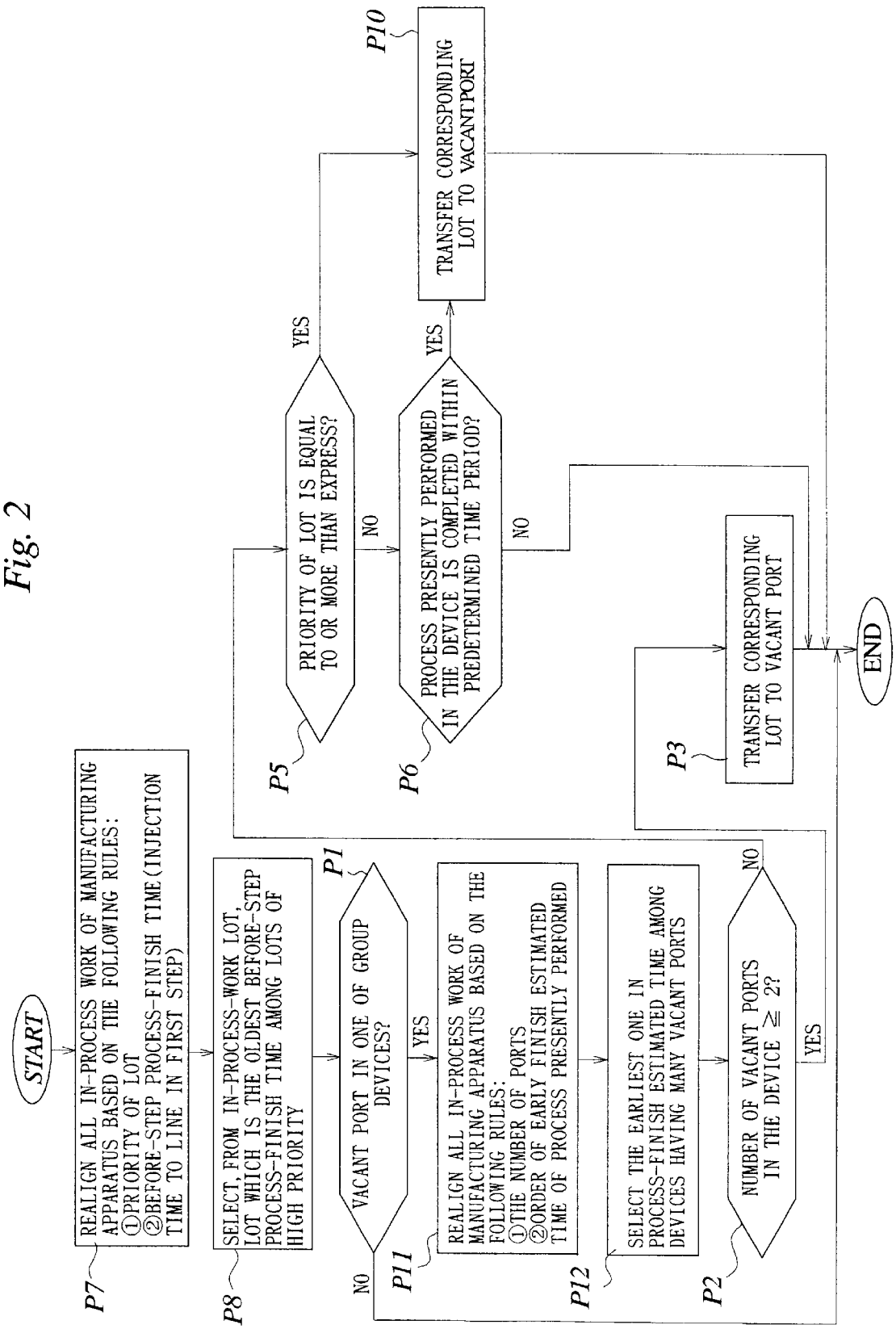
FIG. 2 is an explanatory view illustrating a process for manufacturing a semiconductor device, which is a first embodiment of the present invention.

FIG. 2 illustrates a processing flow of the first embodiment. This processing flow start operating when a condition or a port condition of an apparatus in the group of apparatuses changes, and when the completion time is equal to or later than predetermined set time, and when a new lot is added to the process steps of the above group of apparatuses. Also, apparatuses to be selected in the processing flow are ones that are not in an abnormal state (for example, breakdown, preventive maintenance PM or quality control QC).

First, in steps P7 and P8, a high-priority lot having the oldest process-finish time in the before-step is selected from the process steps of the above group of apparatuses. Then, vacant ports of the apparatuses belonging to the group of apparatuses are confirmed in step P1. Thereafter, apparatuses each of which has a large number of vacant ports and of which the processing is completed earliest among the presently operating apparatuses is selected in steps P11 and P12. As a matter of course, if there are apparatuses, in each of which ports are now all vacant and which are performing no processes, then they are selected.

Then, the number of vacant ports in the apparatuses selected in step P12 is confirmed in step P2, and, in the presence of two or more than two vacant ports, the lot selected in step P8 is transferred to the above apparatuses (step P3). In the case where the number of vacant ports is one, the priority of the lot is confirmed in step P5, and if the priority of the lot selected in step P8 is not less than a predetermined value (for example, express), the lot is transferred to the above apparatuses (step P10). If the priority of the above lot is less than the predetermined value, then the remaining time period of each process that the above apparatuses are presently performing is confirmed in step P6. If the remaining processing time period of each of the above apparatuses is not more than a predetermined set value (first set value (for example, 5 minutes)), the lot is transferred to the above apparatuses (step P10). Note that the apparatus selecting portions of steps P11 and P12 may be changed to select ones among the apparatuses in which the process-finish estimated time is earliest from among the apparatuses in which the number of vacant ports is one or more.

Methods for recognizing the predetermined set value will be described here. In the first embodiment, it is possible to illustrate the following three methods.

A first method is a means in which the manufacturing apparatus EQ3 reports the factory host FHST (see FIG. 1) when the remaining time period for processing a lot LC by the manufacturing apparatus EQ3 becomes a predetermined-set value (first set value (for example, 5 minutes)).

A second method is a means in which: the process-completion time managing portion PFTC (see FIG. 1) calculates a process-completion time for the lot LC by the manufacturing apparatus EQ3 to obtain the remaining processing time period based on the calculated time; and the process-completion time managing portion PFTC reports the factory host FHST when the remaining processing time period has become the predetermined set value (first set value (for example, 5 minutes)). In this case, either of the following two methods is selected depending on whether the manufacturing apparatus EQ3 is a sheet-wise processing type or a batch-wise processing type.

When the manufacturing apparatus EQ3 is a sheet-wise processing type, it holds a process-start time T1 for a lot LC by the manufacturing apparatus EQ3, the number M1 of sheets of semiconductor wafers included in the lot LC, an average processing time T2 by the manufacturing apparatus EQ3 per single semiconductor wafer included in the lot LC, and the number N1 of processing chambers owned by the manufacturing apparatus EQ3. If it is assumed that time period required for processing the lot LC by the manufacturing apparatus EQ3 is T3, then the value for T3 can be obtained from the equation $T3=M1 \times T2/N1$, so that it is possible to calculate the process-completion time for the lot LC by the manufacturing apparatus EQ3, based on T3 and T1.

When the manufacturing apparatus EQ3 is a batch-wise processing type, it is possible to calculate the process-completion time for the lot LC by the manufacturing apparatus EQ3 based on the process-start time for the lot LC by the manufacturing apparatus EQ3 and the time period required per lot processed by the manufacturing apparatus EQ3.

A third method is a means for calculating the process-completion time for the lot LC by the manufacturing apparatus EQ3 based on the following steps performed by the process-completion time managing portion PFTC. More particularly, process-start time T1 of the manufacturing apparatus EQ3 for the lot LC is first hold. By obtaining in advance an average processing time required for performing each step of the manufacturing apparatus EQ3, a time period T3 required for processing the lot LC is obtained. The process-completion time managing portion PFTC calculates process-completion time for the lot LC by the manufacturing apparatus EQ3 obtained by these T1 and T3, and reports the factory host FHST when the remaining processing time period becomes not more than the predetermined set value.

Figure 3:
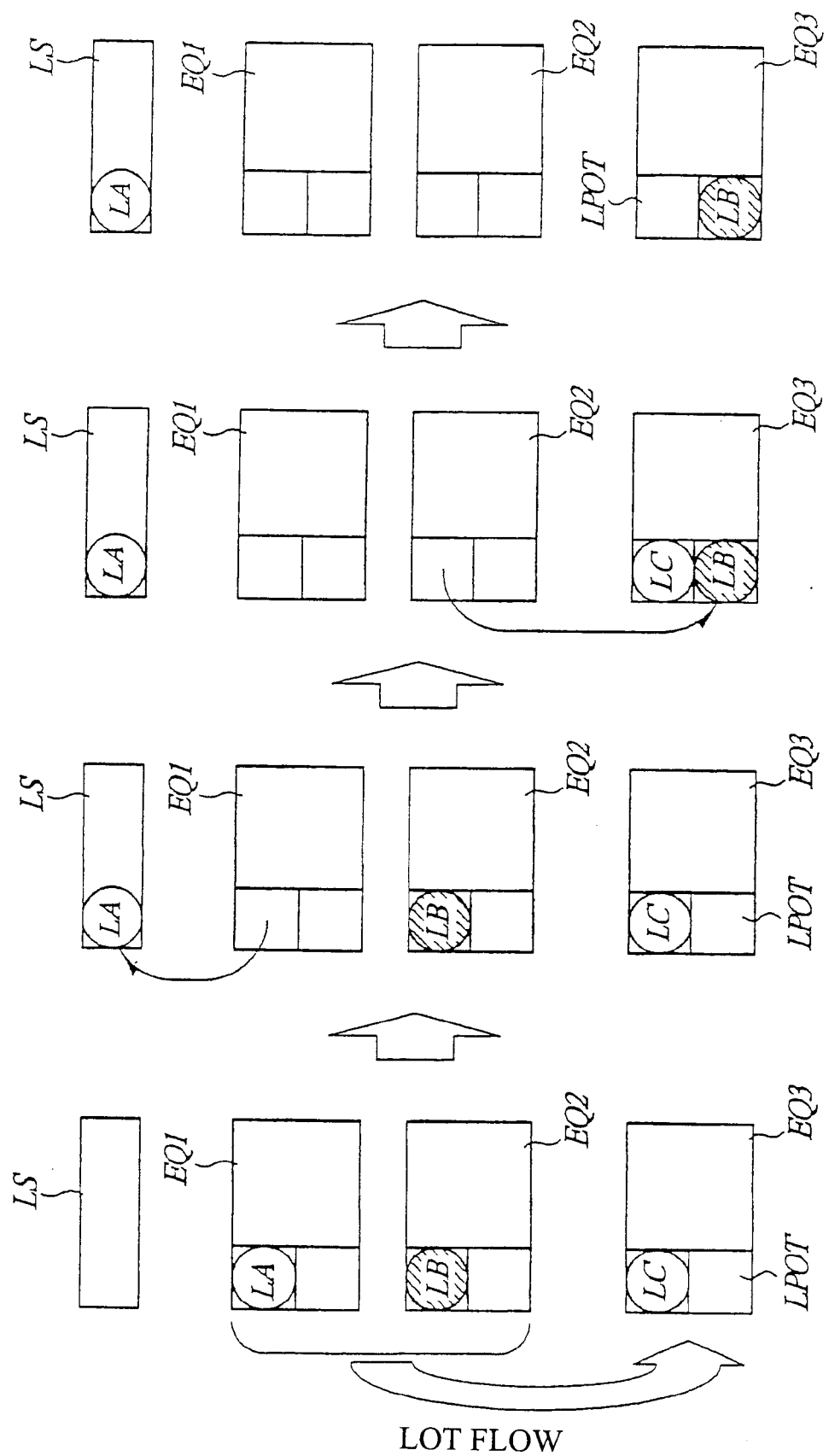
FIG. 3 is an explanatory view illustrating the main portions of the process for manufacturing a semiconductor device, which is a first embodiment of the present invention.

FIG. 3 illustrates real movements of a lot in the first embodiment. In FIG. 3, only the manufacturing apparatus EQ3 is effective as the group of apparatuses performing the second process. Upon completion of processes for a lot LA that is subjected to the first process in the manufacturing apparatus EQ1, the lot LA begins the process steps of the second process, so that the processing as illustrated in FIG. 2 is actuated with respect to the group of apparatus performing the second process. By performing steps P7 and P8, the lot LA is selected. Vacant ports in the group of second processing apparatuses are then confirmed and the manufacturing apparatus EQ3 is selected by performing steps P11 and P12. Since the number of vacant ports is one in step P2, the manufacturing apparatus EQ3 proceeds to step P5. Next, since the priority of the lot LA is normal, the manufacturing apparatus EQ3 proceeds to step P6. In step P6, the process-completion estimated time of the manufacturing apparatus EQ3 is confirmed, and when it exceeds the predetermined set time, no allotment of the lot LA to the manufacturing apparatus EQ3 is performed. Since the lot LA that has not been allotted is remaining on the port of the manufacturing apparatus EQ1, this lot LA is transferred to a lot stocker (first standby area) to make the port of the manufacturing apparatus EQ1 vacant. Thereby, the number of vacant ports of the manufacturing apparatus EQ1 is increased and the vacant ports in the group of first processing apparatuses occur. Next, upon completion of the processing of an express lot LB in the manufacturing apparatus EQ2, processes in FIG. 2 are repeatedly actuated for the group of second processing apparatuses. In this case, the express lot LB is selected in steps P7 and P8 while the manufacturing apparatus EQ3 is selected in steps P11 and P12. Thereafter, the express lot LB is transferred to the manufacturing apparatus EQ3 through steps P2, P5 and P10. Then, after the process-completion of the lot LC that is being treated in manufacturing apparatus EQ3, the processes for the express lot LB are performed. By performing the above processing flow for all of the groups of apparatuses in the manufacturing line, all the lots state being manufactured in accordance with their priorities, and lots having finished the final step are ejected from the manufacturing line as completed products. According to the first embodiment, when the remaining processing time period of the manufacturing apparatus EQ3 becomes not more than the predetermined set value before the process-completion of the express lot LB in the manufacturing apparatus EQ2, the lot LA may of course be first transferred to the manufacturing apparatus EQ3 to start being manufactured. Thereby, time period during which no processes are made while any process steps are still remaining for the manufacturing apparatus EQ3 can be reduced as much as possible, so that it is possible to effectively make use of the processing performance of the manufacturing apparatus EQ3.

Figure 4:
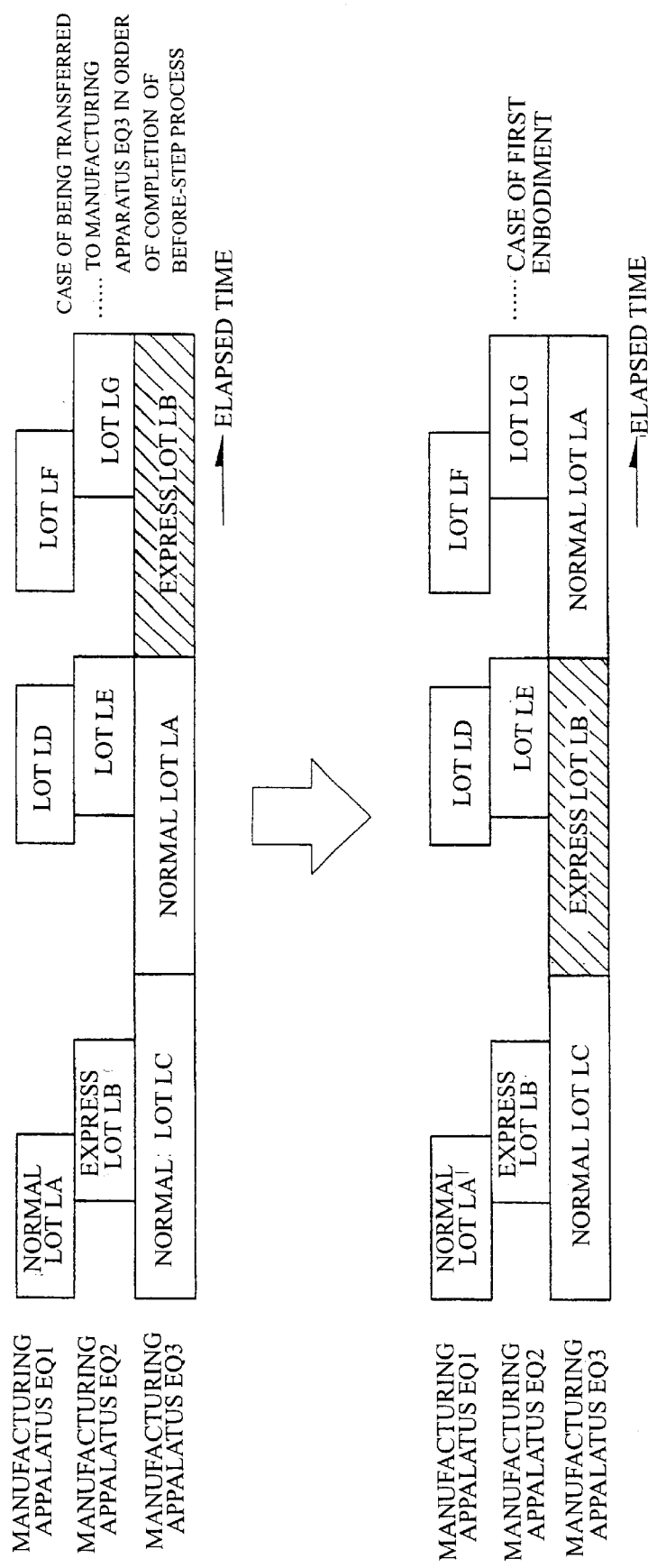
FIG. 4 is an explanatory view showing a Gantt chart relating to a manufacturing apparatus utilized in a process for manufacturing a semiconductor device that is a first embodiment of the present invention, that is, the Gantt chart obtained by comparing the case of allotting lots to a manufacturing apparatus based on order of completion of a step immediately before the processing in an after-step of the manufacturing apparatus and the case of allotting lots to the manufacturing apparatus based on a method according to a first embodiment of the present invention.

FIG. 4 shows a Gantt chart showing illustrating respective operating conditions of the manufacturing apparatuses EQ1, EQ2 and EQ3, and allotment of lots to the respective manufacturing apparatuses, and is shown by aligning: the case of transferring the lots to the manufacturing apparatus EQ3 in the order of the fact that the steps immediately before being transferred to the manufacturing apparatus EQ3 are completed; and the case of allotting the lots to the manufacturing apparatus EQ3 by the method of the above-described first embodiment. There are also illustrated allotments of other lots LD, LE, LF and LG other than the above normal lots LA and LC and the express lot LB.

By employing the means for transferring the lot LA and the express lot LB of the first embodiment as described above, it is possible to increase the probability that a vacant port LPOT will be present in the manufacturing apparatus EQ3 utilized in the following steps at the time when the processes of the express lot LB by the manufacturing apparatus EQ2 are completed. For this reason, as illustrated in FIG. 4, even if the processes for the express lot LB by the manufacturing apparatus EQ2 is completed after that for the normal lot LA by the manufacturing apparatus EQ1, it is possible to perform the processes for the express lot LB by the manufacturing apparatus EQ3 prior to the lot LA. As a result, it is possible to shorten the TAT for the express lot LB.

Also, if the above-mentioned express lot LB is a sample lot, it is possible to shorten the TAT for the express lot LB and so shorten the development period for new products. Thereby, it is possible to ship products with high market value for a short period of time as early as possible.

Further, even if production lines for semiconductor device according to the first embodiment may be of a complicated system or if the same manufacturing apparatuses need to be used repeatedly by employing a means for allotting the lots to the manufacturing apparatuses as described with reference to FIGS. 2 and 3, then, for example, by making a Gantt chart for all the manufacturing apparatuses in the production line, it is possible to performing detailed scheduling of plans for starting being manufactured in advance and to omit such steps as to transfer the lots to the manufacturing apparatus in accordance with the scheduling and as to start being manufactured. Moreover, it is possible to prevent the drawback in which there occurs a time lag between the actual manufacture-start and process-finish times and the schedule made in advance, and so to prevent another drawback in which the lot-transfer waiting time occurs in the manufacturing apparatus EQ3 and the utilization rate of the manufacturing apparatus EQ3 is reduced. That is, it is possible to the drawback in which the yield of the semiconductor device according to the first embodiment is reduced.

Further, if an accidental abnormality (for example, occurrence of foreign matters or the like) in the manufacturing apparatus EQ3 planning transferring the express lot LB occurs by employing a means for allotting the lots to the manufacturing apparatuses as described with reference to FIGS. 2 and 3, then it is possible to transfer the express lot LB to another manufacturing apparatus EQ3 in accordance with the order of priority of transferring the lots given to the manufacturing apparatus EQ3 as described above. Thereby, even if there occurs an accidental abnormality in the manufacturing apparatus EQ3 planning transferring the express lot LB, it is possible to omit the step of rescheduling in detail manufacture-start plans of all the manufacturing apparatuses in the production line for semiconductor device according to the first embodiment. As a result, there are unnecessary high-speed scheduling tools with high reliability and a complicated system for grasping the present status of the production line, and so it is possible to reduce the manufacturing cost of the semiconductor devices according to the first embodiment. Further, even if there occurs the above-mentioned accidental abnormality in the manufacturing apparatus EQ3, the rescheduling steps can be omitted and so it is possible to prevent a reduction in the utilization rate of the production line for semiconductor device of the first embodiment. Namely, it is possible to operate the production line for semiconductor device of the first embodiment in a stable manner.

By employing the means for allotting the lots to the manufacturing apparatuses as described above with reference to FIGS. 2 and 3 and by appropriately setting a set time period (first set value) for the remaining processing time period for the lot LC, which is performed in the manufacturing apparatus EQ3, it is possible to prevent the operation of the manufacturing apparatus EQ3 from stopping because the manufacturing apparatus EQ3 comes to a lot-transfer waiting condition. Thereby, it is possible to prevent the yield of the production line for semiconductor device of the first embodiment from being reduced.

There has been illustrated the case where the processes for the lot LA by the manufacturing apparatus EQ1 are completed prior to those for the express lot LB by the manufacturing apparatus EQ2 in the above-mentioned first embodiment. However, if the processes for the express lot LB by the manufacturing apparatus EQ2 are completed prior to those for the lot LA by the manufacturing apparatus EQ1, the express lot LB is transferred to the manufacturing apparatus EQ3 in the following manner.

Upon completion of the first process for the express lot LB, the express lot LB becomes work in process for the group of second processing apparatuses and the processing flow as illustrated in FIG. 2 is actuated. The express lot LB is selected in steps P7 and P8, and the manufacturing apparatus EQ3 is selected in steps P11 and P12. The number of vacant ports of the manufacturing apparatus EQ3 is one at this time. However, since the above-mentioned lot is an express lot, it is transferred to the manufacturing apparatus EQ3 through steps P5 and P10, thereby starting being manufactured after the processes being presently performed in the manufacturing apparatus EQ3 are completed.

Next, a semiconductor device that is manufactured in the production line for semiconductor device according to the first embodiment will be described with reference to FIG. 5. The semiconductor device of the first embodiment may have, for example, a CMIS (Complementary MIS) gate array.

Figure 5:
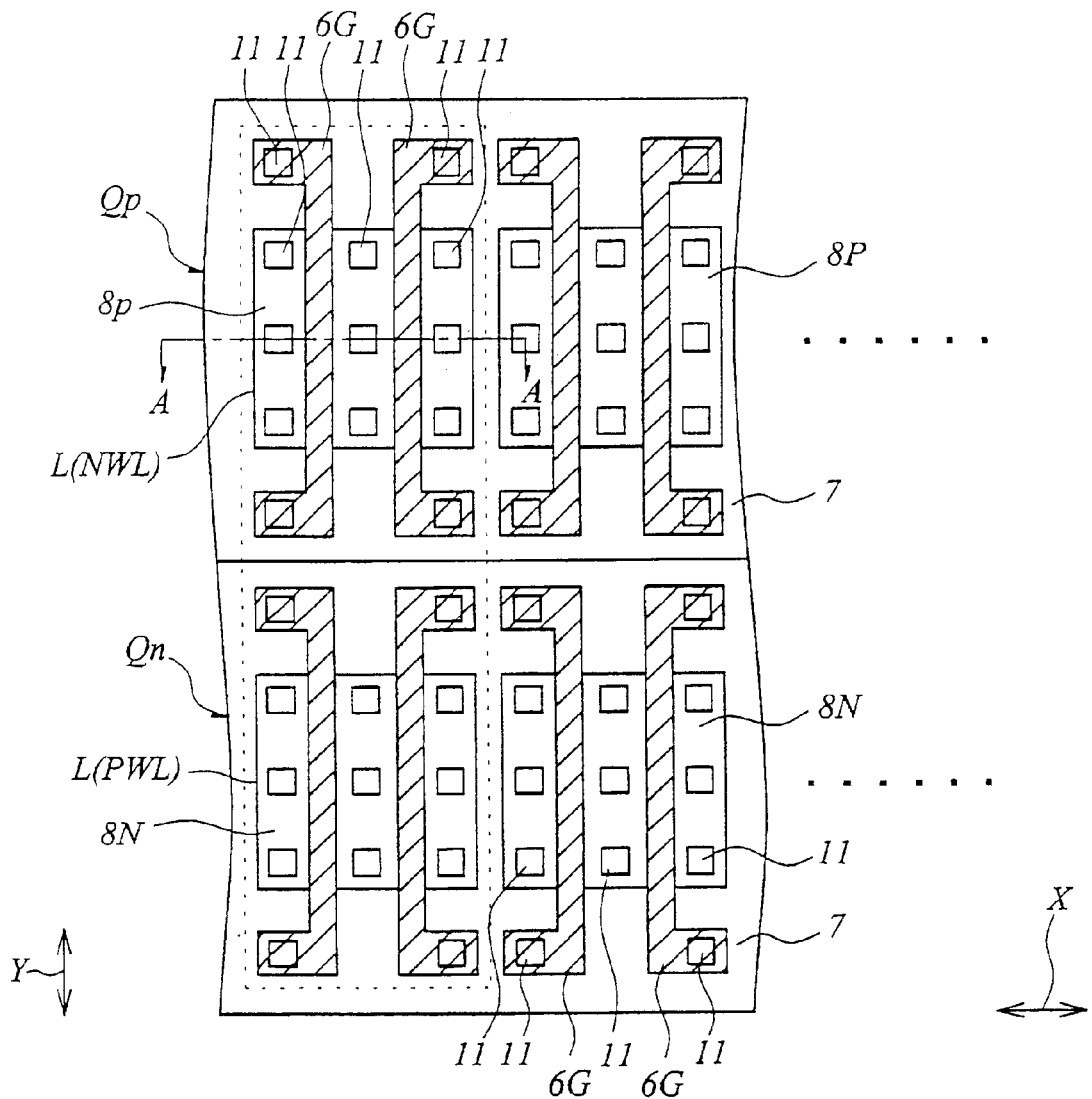
FIG. 5 is a cross-sectional view showing a principal portion of a semiconductor device that is a first embodiment of the present invention.
Figure 6:
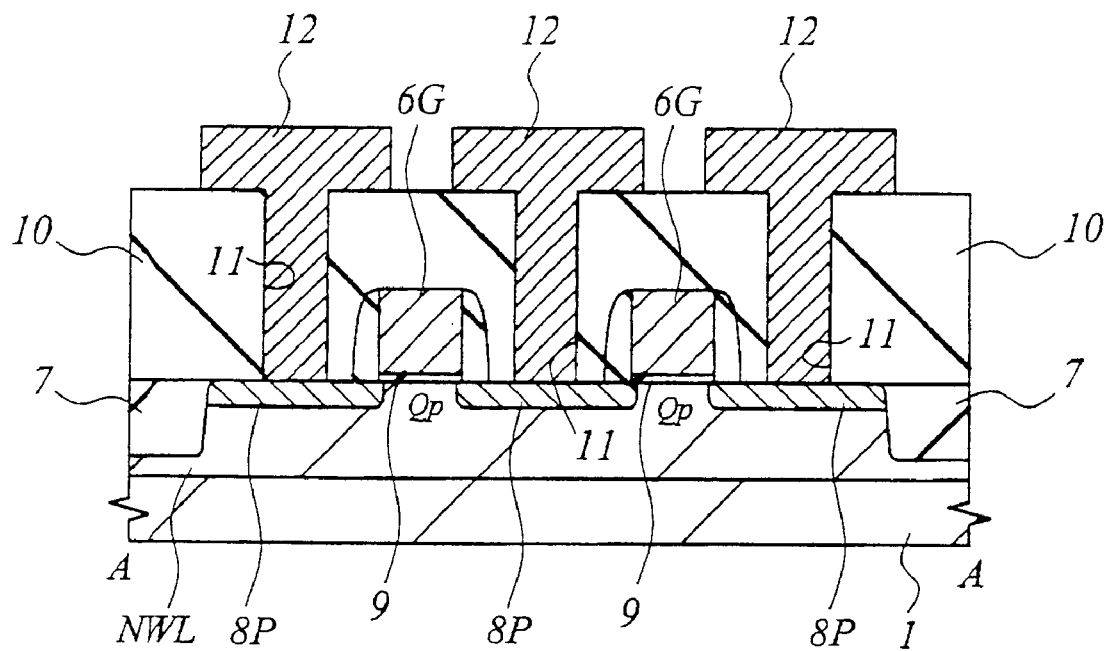
FIG. 6 is a cross-sectional view taken along line A—A in FIG. 5.

FIG. 5 illustrates one example of an enlarged plan view of a principal portion of a semiconductor device according to the first embodiment, and FIG. 6 illustrates a cross-sectional view taken along line A—A in FIG. 5. Here, there is exemplified a structure in which a basic cell, which forms the CMIS gate array that is the semiconductor device of the first embodiment, has two p-channel type MISFETs (Metal Insulator Semiconductor Field Effect Transistors) Qp and two n-channel type MISFETs Qn. A CMIS circuit can be formed by the p-channel type MISFET Qp and the n-channel type MISFET Qn. Each of the p-channel type MISFET Qp and the n-channel type MISFET Qn in the basic cell includes a pattern having an active area L and two strip-like gate electrodes 6G disposed to intersect the active area. The basic cell with such a pattern is repeatedly disposed along X and Y directions. For example, on a main surface of a semiconductor substrate 1 formed of p-type mono-crystalline silicon, there are alternately disposed, along the Y direction, strip-like patterns of n-type wells NWL and p-type wells PWL extending along the X direction. The above p-channel type MISFET Qp is disposed within the area of the n-type wells NWL while the above n-channel type MISFET Qn is disposed within the area of p-type wells PWL. The n-type wells NWL and the p-type wells PWL are each formed by containing a desired impurity from the main surface of the semiconductor substrate 1 to a desired depth. The n-type well NWL contains, for example, P (phosphor) or As (arsenic) and the p-type wells PWL contains, for example, B (boron). On the main surface of the semiconductor substrate 1, there is formed a groove-like isolating portion (SGI: Shallow Groove Isolation or STI: Shallow Trench Isolation) 7. The isolating portion 7 is formed, in which an insulating layer formed of, example, a silicon oxide ($SiO_2$ etc.) film is embedded into grooves dug in the width direction of the semiconductor substrate 1, and it defines the above-mentioned active area L in a planar sense. Note that the isolating portion is not limited to one of groove-type, and may also be constituted by a field insulating layer formed by employing a selective oxidation method (LOCOS: Local Oxidation of Silicon).

The two p-channel type MISFETs Qp included in the basic cell have p-type semiconductor areas 8P for source and drain, gate insulating films 9, and gate electrodes 6G. Each p-type semiconductor area 8P contains, for example, B. The central p-type semiconductor area 8P between the gate electrodes 6G adjacent and parallel to each other among the p-type semiconductor areas 8P is an area common to the two p-channel type MISFETs Qp. Note that for the purpose of restricting hot carriers, each p-type semiconductor area 8P may be a so-called LDD (Lightly Doped Drain) structure in which each p-type semiconductor area 8P is comprised of: a low impurity density area disposed on the channel side of the MISFET; and a high impurity density area formed at such a position as to be only the low impurity density area away from the channel electrically connected thereto. Also, for the purpose of restricting punch-through between source and drain, semiconductor areas may be provided, each of which is a conductive type different from the p-type semiconductor areas 8P, at predetermined deep positions from the main surface of the semiconductor substrate 1 in the vicinity of end portions of the channel side of each p-type semiconductor area 8P.

The two n-channel type MISFETs Qn of the above basic cell have n-type semiconductor areas 8N for source and drain, gate insulating films 9, and gate electrodes 6G. Each n-type semiconductor area 8N contains, for example, P or As. Similarly to each p-channel type MISFET Qp, the central n-type semiconductor area 8N in the basic cell is an area common to the two n-channel type MISFETs Qn. Note that similarly to the p-channel type MISFETs Qp, each of the n-channel type MISFETs Qn may also be of a LDD structure or of a structure in which a p-type semiconductor area is provided for the purpose of restricting punch-through.

The gate insulating films 9 of the p-channel type MISFETs Qp and the n-channel type MISFETs Qn may each be formed of, for example, a silicon oxide film. Also, the gate insulating films 9 may be formed of a silicon oxide nitride film (SiON film). This can suppress occurrence of surface level in the gate insulating films 9 and simultaneously reduce electron traps in the gate insulating films 9, and so improve resistance to hot-carriers. For this reason, it becomes possible to improve operating reliability of the p-channel type MISFETs Qp and the n-channel type MISFETs Qn.

The gate electrodes 6G of the p-channel type MISFETs Qp and the n-channel type MISFETs Qn are each formed by, for example, depositing a metallic layer such as W (tungsten) etc. on an n-type low resistance poly-crystalline silicon film through a barrier metallic film such as Tin (titanium nitride) or WN (tungsten nitride) or the like in order from a lower layer (which is a so-called poly-metallic structure). When a tungsten film is directly stacked onto the low resistance poly-crystalline silicon film, such barrier metallic film has a function or the like of preventing silicide from being formed at contact portions thereof due to an heat treatment during the manufacturing processes. By employing a poly-metallic structure, the resistance of the gate electrodes 6G can be reduced and the operating speed of gate array can be improved. However, each structure of the gate electrodes 6G is not limited to the poly-metallic structure, and may be formed by, for example, a single layer of low resistance polycrystalline silicon or may be a so-called polycide structure obtained by depositing a silicide film such as tungsten silicide etc. on the low resistance polycrystalline silicon film. Broad width portions are formed at both end portions (positions overlapping with the isolating area at the outer periphery of each active area L) in the longitudinal direction of each gate electrode 6G, in which contact holes with respect to upper layer wirings are disposed. Further, the gate electrodes 6G of the p-channel type MISFETs Qp and the n-channel type MISFETs Qn are formed to each have the same size through a patterning step performed by the same photolithography technique or dry etching technique. However, the structure of the basic cell is not limited to the above-described one and may be variously modified. For example, it is also possible to dispose MISFETs having different gate-electrode sizes within a single basic cell, for example, dispose a MISFET with relatively small gate width and a MISFET with relatively large gate width within a single basic cell, or the like. For this reason, if it is desired to connect, for example, a MISFET operated by a small driving current (MISFET with a relatively small gate width), to an input of a logic circuit that is comprised of a MISFET operated by a large driving current (MISFET with a relatively large gate width), then the connection therebetween can be realized though a short wiring path.

On the semiconductor substrate 1 on which the p-channel type MISFETs Qp and the n-channel type MISFETs Qn are formed, an insulating film 10 composed of, for example, a silicon oxide (SiO$_2$ etc.) film is formed. Note that the insulating film 10 is omitted in FIG. 5 because of easily understanding of an elemental structure. Contact holes 11 are formed in the insulating film 10, and one example of arrangement of the contact holes 11 is illustrated in FIG. 5. The contact holes 11 are formed to overlap with: the broad width portions of each gate electrode 6G; the p-type semiconductor areas 8P; and the n-type semiconductor areas 8N. Here, all contact holes 11 connectable to the basic cell are illustrated. Actually, the contact holes 11 may be differently disposed per product. Parts of the broad width portions of the gate electrodes 6G, the p-type semiconductor areas 8P, or the n-type semiconductor areas 8N are exposed from bottom portions of the respective contact holes 11. In the gate array, the plurality of basic cell patterns as described above is formed into the semiconductor substrate 1 as a common pattern. By connecting hole patterns (contact holes 11 and via holes) and wirings between the plurality basic cells, a desired logic circuit can be formed. In other words, it is possible to form various logic circuits through different ways of layout constituted by the hole patterns and the wirings.

In FIG. 6, one example of a wiring 12 to be connected to, for example, the above p-type semiconductor areas 8P is also illustrated. Note that the wiring 12 is omitted in FIG. 5 because of easily understanding of the elemental structure. Also, although not shown in the drawings, the similar wiring 12 is connected to the n-type semiconductor areas 8N as well. The wiring 12 may be formed by: sequentially depositing a Ti (titanium) film, an Al alloy film and a titanium nitride film onto the insulating film 10; and patterning the Ti film, the Al alloy film and the titanium nitride film through dry etching by using a photoresist film (not shown) as a mask.

(Second Embodiment)

A second embodiment is one obtained by replacing the steps P5, and P6 illustrated in FIGS. 2 and 3 of the first embodiment, with other steps.

Figure 7:
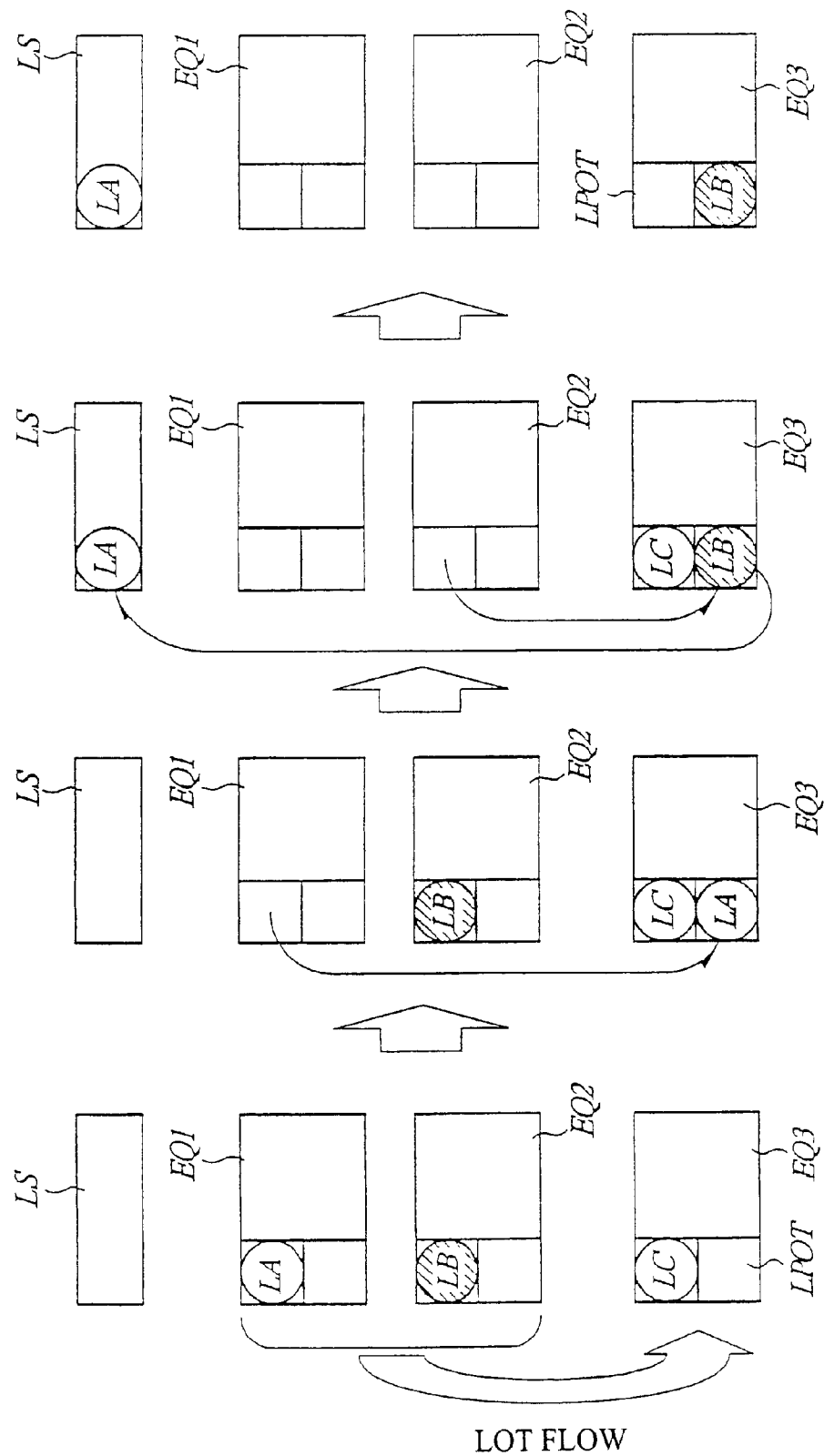
FIG. 7 is an explanatory view illustrating a principal portion of a process for manufacturing a semiconductor device, which is a second embodiment of the present invention.

In the second embodiment, as illustrated in FIG. 7, even if the number of vacant ports LPOT of the manufacturing apparatus EQ1, derived from the step P1 (see FIG. 2) illustrated in the above first embodiment, is only one, then the normal lot LA in which the processes of the manufacturing apparatus EQ1 have been completed is transferred to the vacant port LPOT of the manufacturing apparatus EQ3. Thereafter, if the processes of the express lot LB by the manufacturing apparatus EQ2 are completed before those of the lot LA by the manufacturing apparatus EQ3 is started, then the lot LA having been transferred to the manufacturing apparatus EQ3 is transferred to a lot stocker LS and the express lot LB is transferred to the vacant port LPOT of the manufacturing apparatus EQ3, which is brought due to the transferring of the lot LA brings. At this time, the transfer of the express lot LB to the manufacturing apparatus EQ3 is preferably carried out immediately after completion of the transfer of the lot LA to the lot stocker LS. For this reason, similarly to the above first embodiment, if the processes of the lot LC by the manufacturing apparatus EQ3 are performed, the processes for the express lot LB are started subsequently to the completion of the processes for the lot LC. By performing the above processing flow through all of the groups of apparatuses in the production line, all lots start being manufactured in accordance with the priorities thereof, and the lots having completed the final step are ejected from the production line as completed products.

According to the above second embodiment, the lot LA is transferred to the lot stocker LS in transferring the express lot LB to the vacant port LPOT of the manufacturing apparatus EQ3. Therefore, depending on the transferring timing of the lot LA and the express lot LB, there arises the drawback of the fact that the utilization rate of the manufacturing apparatus EQ3 is reduced due to its shift to the lot waiting condition and that the TAT of the express lot LB becomes slightly longer. Thereat, steps of the above second embodiment are applied to the case of utilizing the relatively lower manufacturing apparatus EQ3 in utilization rate. This can prevent a reduction in the utilization rate of the manufacturing apparatus EQ3 and an elongation in the TAT of the express lot LB.

It is possible to achieve the same advantages as those of the first embodiment even by employing the above second embodiment. Further, as described above, by applying the steps of the second embodiment to the case of using the relatively lower manufacturing apparatus EQ3 in utilizing rate and by applying the steps P5 and P6 of the above first embodiment to the case of using the manufacturing apparatus EQ3 other than the relatively lower one, it is possible to more effectively obtain the same advantages as those of the first embodiment or the second embodiment, in comparison to the case of singly applying the steps of the second embodiment or the steps P5 and P6 of the first embodiment.

(Third Embodiment)

A third embodiment applies, to a transfer step of reticles (photo masks), the same transfer means as those of the lot LA (see FIGS. 3 and 7) and the express lot LB (see FIGS. 3 and 7) described in the above first embodiment and the above second embodiment, in the case where the manufacturing apparatus EQ3 as illustrated in the above first embodiment and the above second embodiment (see FIGS. 3 and 7) is an exposure device.

Figure 8:
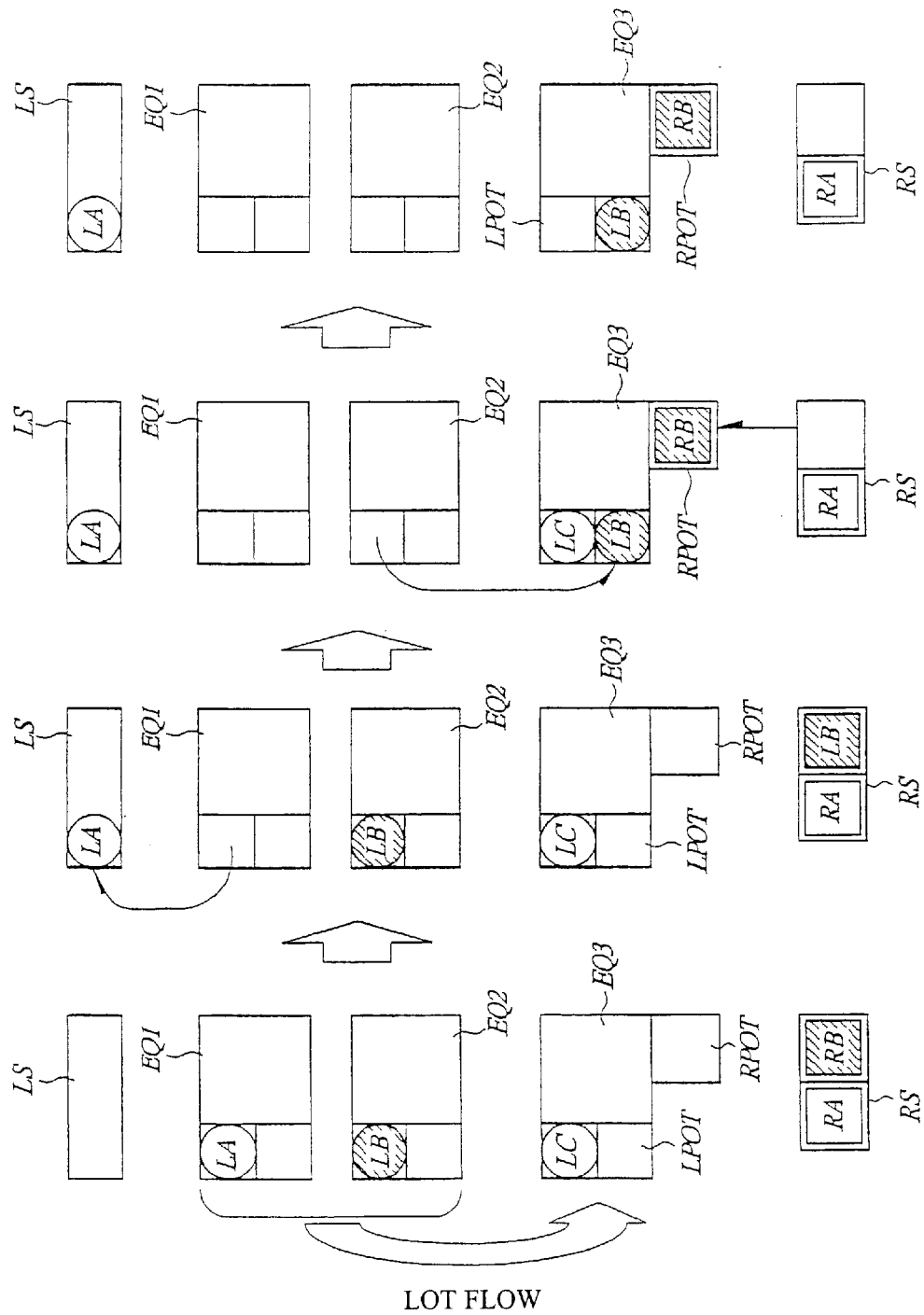
FIG. 8 is an explanatory view illustrating a principal portion of a process for manufacturing a semiconductor device, which is a third embodiment of the present invention.

FIG. 8 illustrates a transfer means for a reticle RB used in an exposing process for the express lot LB in the manufacturing apparatus EQ3 while the lot LA and the express lot LB described in the first embodiment are transferred. Reticles RA and RB respectively used in the exposure-process for the lot LA and the express lot LB by the manufacturing apparatus EQ3 are stored in a reticle stocker (second standby area) RS disposed in the vicinity of the manufacturing apparatus EQ3. In this case, as described in the above first embodiment, in transferring the lot LA to the lot stocker LS, the reticle (second photo mask) RA used for the exposing process of the lot LA by the manufacturing apparatus EQ3 is continuously stored in the reticle stocker RS without being transferred out from the reticle stocker RS. In transferring the express lot LB to the manufacturing apparatus EQ3 in the step P10 (see FIGS. 2 and 3), the reticle (first photo mask) RB used for the exposure-process of the express lot LB by the manufacturing apparatus EQ3 is transferred from the reticle stocker RS to a reticle port RPOT that the manufacturing apparatus EQ3 has. In other words, simultaneously with the transfer of the lot to the manufacturing apparatus EQ3, a reticle used for the exposing process of the above-mentioned lot is transferred to the above-mentioned manufacturing apparatus EQ3. Since the resist is first applied to the lot in the exposure device, there are weak possibilities that the utilization rate will be reduced in the exposure device owing to waiting of the reticle even when the reticle arrives at the exposure device later than the lot by several minutes. Therefore, the reticle RB can be transferred to the manufacturing apparatus EQ3 so as to correspond to the transfer of the express lot LB to the manufacturing apparatus EQ3 even when the manufacturing apparatus EQ3 is a relatively higher exposure device in utilization rate than the remaining manufacturing apparatuses. Consequently, the exposing process can be performed by the manufacturing apparatus EQ3 with respect to the express lot LB prior to the lot LA even when the processes for the express lot LB by the manufacturing apparatus EQ2 is completed later than the processes for the normal lot LA by the manufacturing apparatus EQ1. In other words, it is possible to shorten the TAT of the express lot LB.

It is also possible to preliminarily transfer the reticle to the exposure device in accordance with the manufacture-start plan. However, by employing the above third embodiment, it is possible to reduce the transferring number of unnecessary reticles, which is caused by the displacement between the manufacture-start plan and the actual order of manufacture-start because accidental breakdowns or the like of exposing devices or the manufacturing apparatuses used in before-steps of the exposing step. For this reason, burdens to operators or loads on the transferring system can be reduced. Thereby, it is possible to shorten an average transfer time period for the reticle and so shorten the TAT for the entire manufacturing line.

Figure 9:
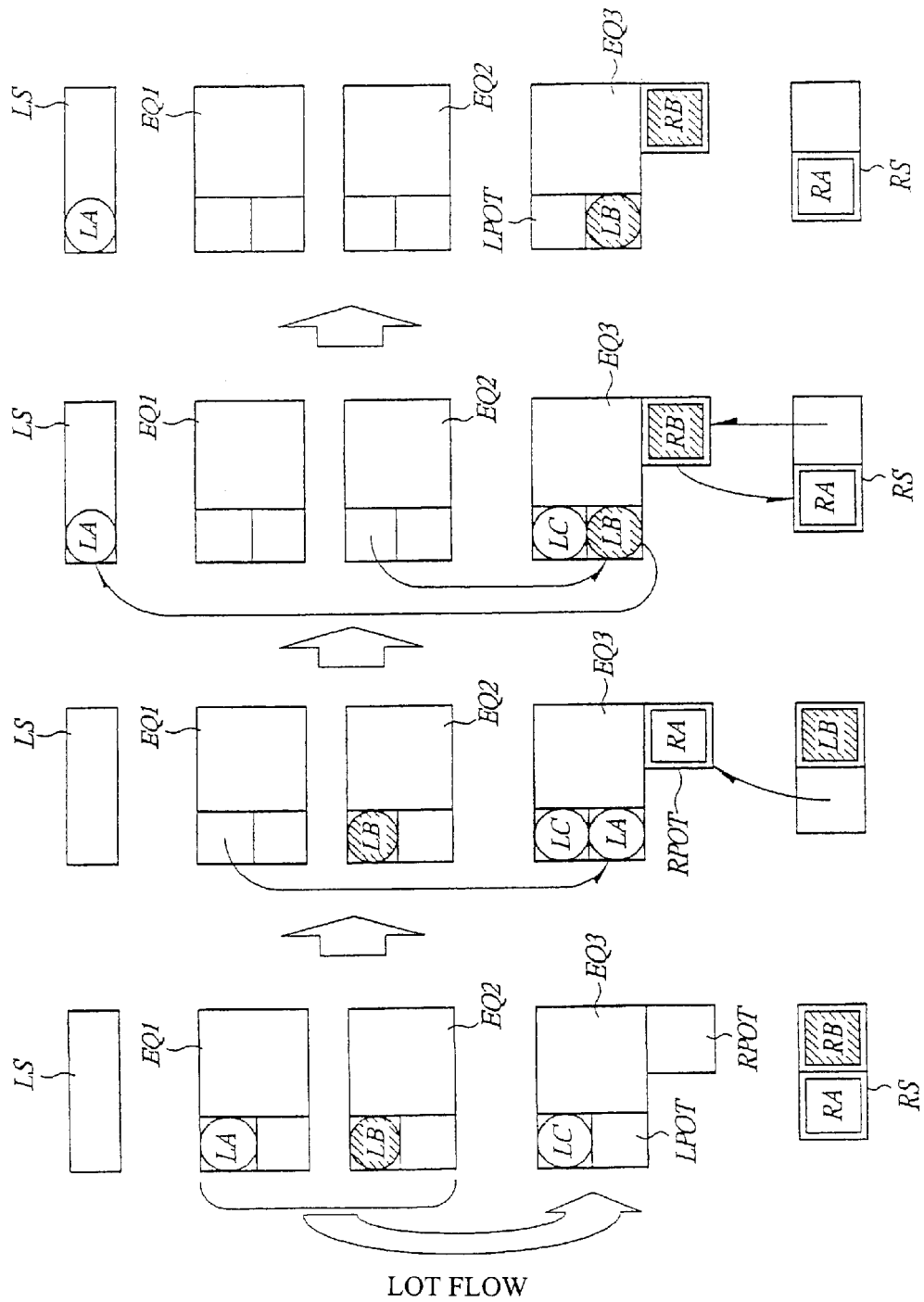
FIG. 9 is an explanatory view illustrating a principal portion of a process for manufacturing a semiconductor device that is a third embodiment of the present invention.

FIG. 9 illustrates a transfer means for the reticle LB, which is used in the exposing process for the express lot LB by the manufacturing apparatus EQ3 during the transferring step of the lot LA and the express lot LB as described with reference to the above second embodiment. Reticles RA and RB respectively used for the exposing process for the lot LA and the express lot LB by the manufacturing apparatus EQ3 are stored in the reticle stocker RS disposed in the vicinity of the manufacturing apparatus EQ3. In this case, at the time of the step of transferring the normal lot LA, in which the processes by the manufacturing apparatus EQ1 as described with reference to the above second embodiment has been completed, to the vacant port LPOT of the manufacturing apparatus EQ3, the reticle LA used in the exposing process of the lot LA is transferred from the reticle stocker RS to a reticle port RPOT that the manufacturing apparatus EQ3 has. Thereafter, the processes for the express lot LB by the manufacturing apparatus EQ2 is completed before those for the lot LA by the manufacturing apparatus EQ3 are started. The lot LA having been transferred to the manufacturing apparatus EQ3 is transferred to the lot stocker LS. At the time of transferring the express lot LB to the vacant port LPOT of the manufacturing apparatus EQ3, which is brought by having transferred the lot LA, the reticle RA is transferred from the reticle port RPOT owned by the manufacturing apparatus EQ3 to the reticle stocker RS, and the reticle RB used for the exposing process of the express lot LB is transferred from the reticle stocker RS to the reticle port RPOT. At this time, the transfer of the reticle RB from the reticle stocker RS to the reticle port RPOT is preferably executed immediately after completion of the transfer of the reticle RA from the reticle port RPOT to the reticle stocker RS, thereby allowing for shortening the TAT for the express lot LB. For this reason, the reticle RB can be transferred to the manufacturing apparatus EQ3 so as to correspond to the transfer of the express lot LB to the manufacturing apparatus EQ3 even when the manufacturing apparatus EQ3 is a relatively higher exposure device in utilizing rate than the remaining manufacturing apparatuses. Consequently, even when the processes for the express lot LB by the manufacturing apparatus EQ2 is completed later than those for the normal lot LA by the manufacturing apparatus EQ1, the exposing process can be performed by the manufacturing apparatus EQ3 with respect to the express lot LB prior to the lot LA. In other words, it is possible to shorten the TAT of the express lot LB.

It is possible to achieve the same advantages as those of the above first embodiment and the above second embodiment also by employing the above third embodiment.

(Fourth Embodiment)

This fourth embodiment shows the cases where the manufacturing apparatus EQ2 (see FIG. 3 or 7) shown in the above first embodiment or second embodiment is not disposed and where only one manufacturing apparatus EQ1 (see FIG. 3 or 7) is disposed. Other apparatuses or the like in the fourth embodiment are arranged similarly to those in the above first embodiment or second embodiment.

Figure 10:
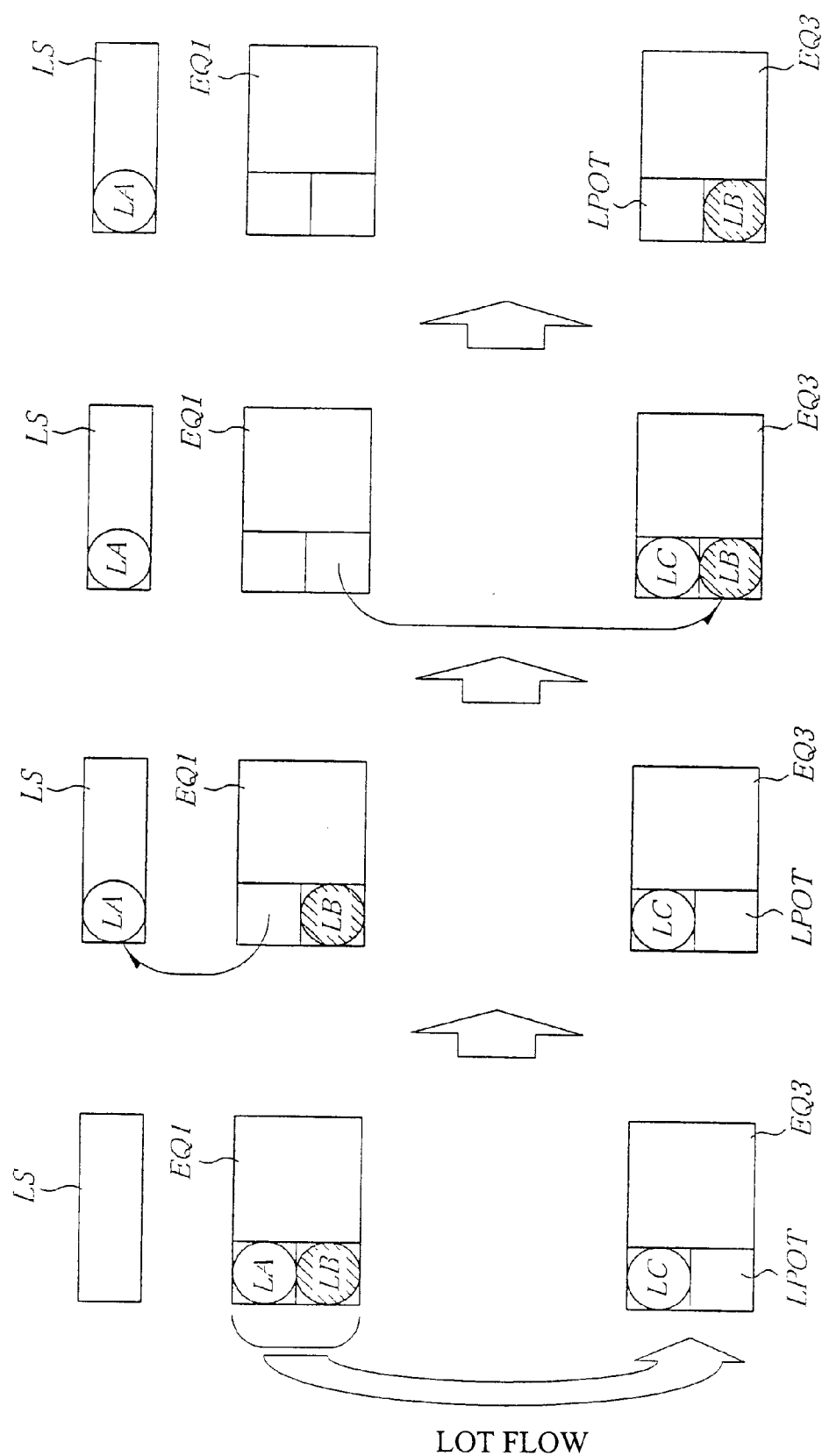
FIG. 10 is an explanatory view illustrating a principal portion of a process for manufacturing a semiconductor device that is a fourth embodiment of the present invention.

FIG. 10 shows one example of the fourth embodiment, which corresponds to the above first embodiment. As illustrated in FIG. 10, in a structure of respective manufacturing apparatuses constituting the fourth embodiment, the manufacturing apparatuses EQ2 are not disposed in comparison to the above first embodiment (see FIG. 3) and the processes of the express lot LB are also performed by the manufacturing apparatuses EQ1.

Even in this fourth embodiment similarly to the above first embodiment, when the process of the lot LA by the manufacturing apparatus EQ1 is completed and the number of vacant port in the manufacturing apparatus EQ3 is one, process-finish estimated time of the lot LC by the manufacturing apparatus EQ3 is identified. If its time exceeds predetermined set time, the allotment of the lot LA to the manufacturing apparatus EQ3 is not made. Since a lot LA having not been allotted thereto is on the port of the manufacturing apparatus EQ1, it is transferred to the lot stocker LS and the port in the manufacturing apparatus EQ1 is vacant. Next, when the process of the express lot LB by the manufacturing apparatus EQ1 is completed, the express lot LB is transferred to the vacant port LOPT of the manufacturing apparatus EQ3. Subsequent movement of each lot is the same as that of the above first embodiment. Also, when a remaining processing time period for the lot LC by the manufacturing apparatus EQ3 is not more than a predetermined set value before the process for the express lot LB by the manufacturing apparatus EQ3 is completed, the lot LA can first be transferred to the manufacturing apparatus EQ3 and start being manufactured.

Figure 11:
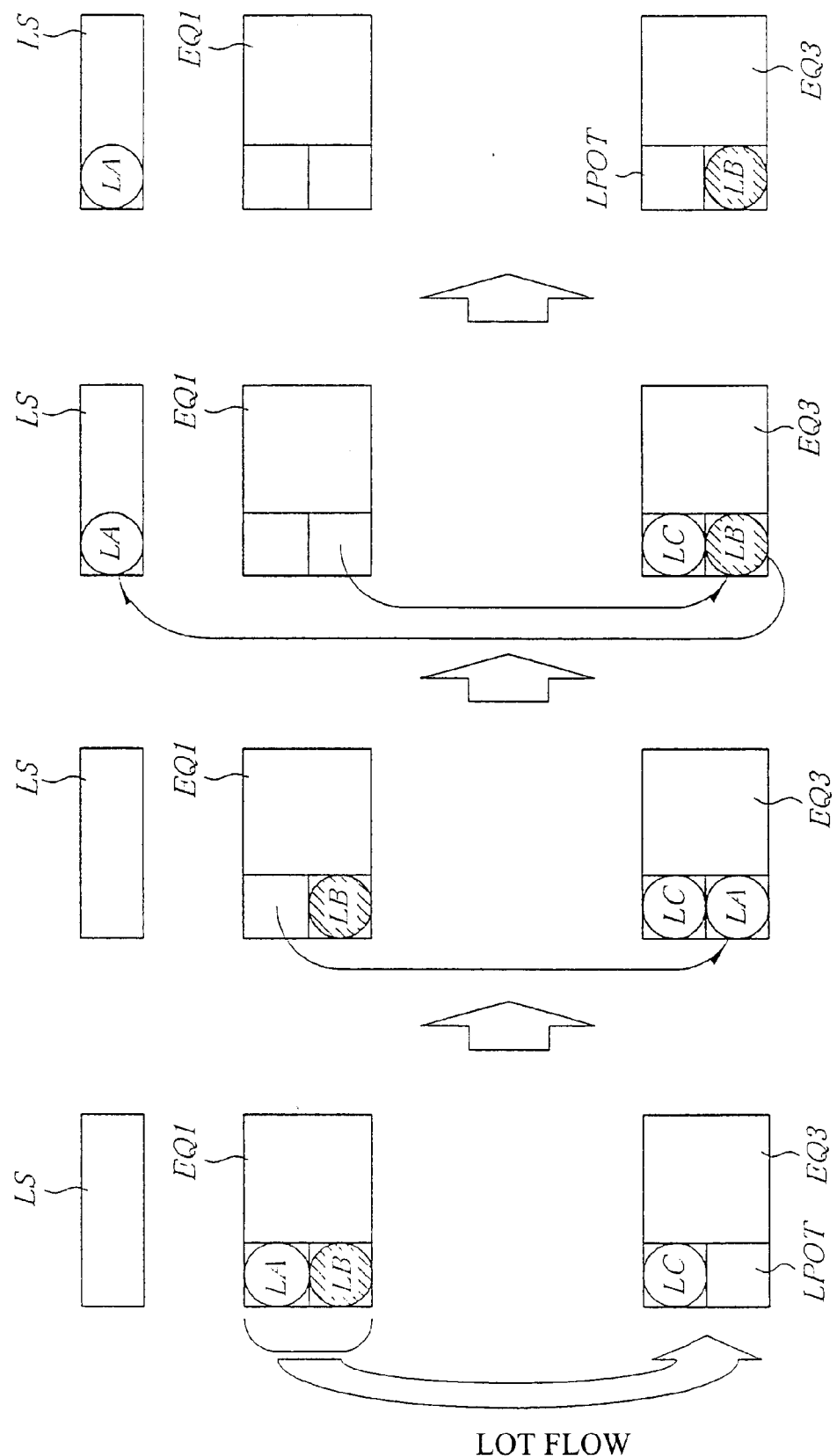
FIG. 11 is an explanatory view illustrating a principal portion of a process for manufacturing a semiconductor device that is a fourth embodiment of the present invention.

FIG. 11 illustrates one example of this fourth embodiment, which corresponds to the above second embodiment. A arrangement structure of respective manufacturing apparatuses shown in FIG. 11 also has no manufacturing apparatus EQ2 similarly to that shown in FIG. 10, and the process of the express lot LB is also performed by the manufacturing apparatus EQ1.

Even in this fourth embodiment similarly to the above second embodiment, also when the number of vacant ports in the manufacturing apparatus EQ3 is only one, the normal lot LA, the process of which by the manufacturing apparatus EQ1 has been completed, is transferred to the vacant port LPOT in the manufacturing apparatus EQ3. Then, when the process of the express lot LB by the manufacturing apparatus EQ2 is completed before the process of the lot LA by the manufacturing apparatus EQ3 starts, the lot LA having been transferred to the manufacturing apparatus EQ3 is transferred to lot stocker LS and the express lot LB is transferred to the vacant port LPOT of the manufacturing apparatus EQ3, which is obtained after the transferring of the lot LA. At this time, immediately after the lot LA is transferred to the lot stocker LS, the transfer of the express lot LB to the manufacturing apparatus EQ3 is preferably performed similarly to the above second embodiment. Subsequent movement of each lot is the same as that of the above second embodiment.

The above fourth embodiment can also achieve the same advantages as the above first or second embodiment. Further, the above fourth embodiment is particularly effective in the case where a processing time period of the lot LA or the express lot LB by the manufacturing apparatus EQ1 becomes shortened or in the case where both processing time periods of the lot LA and the express lot LB by the manufacturing apparatus EQ1 become shortened in comparison with a processing time period of the lot LC being presently processed by the manufacturing apparatus EQ3.

(Fifth Embodiment)

A fifth embodiment describes the cases where the manufacturing apparatus EQ2 (see FIG. 8 or 9) illustrated in the above third embodiment is not disposed and where only one manufacturing apparatus EQ1 (see FIG. 8 or 9) is disposed, and arrangements of other apparatuses and the like is the same as those in the above third embodiment.

Figure 12:
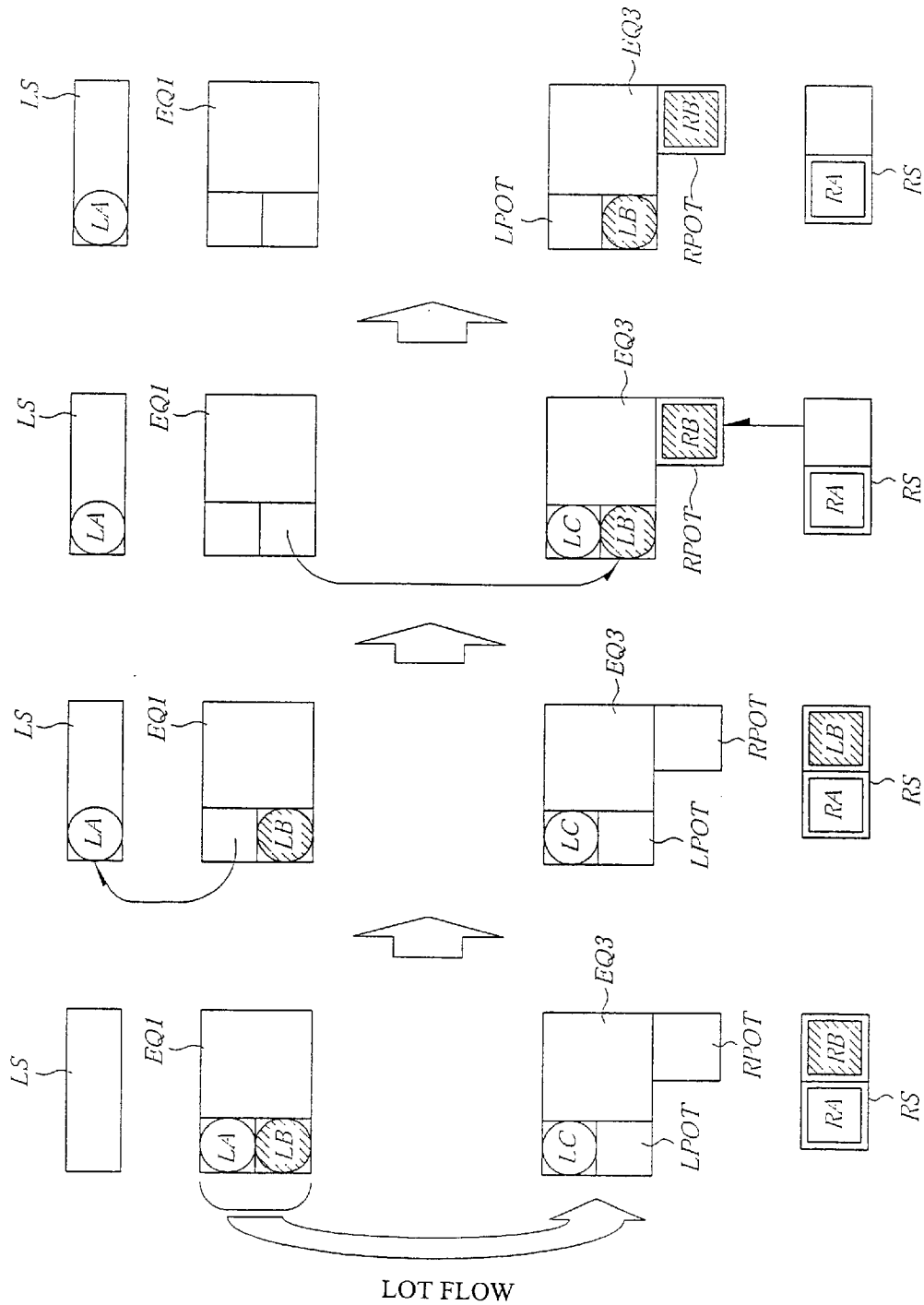
FIG. 12 is an explanatory view illustrating a principal portion of a process for manufacturing a semiconductor device that is a fifth embodiment of the present invention.

FIG. 12 illustrates one example of this fifth embodiment, which corresponds to one shown in FIG. 8 in the above third embodiment. As illustrated in FIG. 12, a arrangement constitution of each manufacturing apparatus in the above fifth embodiment has no manufacturing apparatus EQ2 in comparison with that in the above third embodiment (see FIG. 8), and the process of the express lot LB by the manufacturing apparatus EQ1 is also performed.

In the example illustrated in FIG. 12, the respective movements of the lots LA and LC and the express lot LB are the same as those of the lot LA and the express lot LB that have been described in the above fourth embodiment with reference to FIG. 10.

Even in this fifth embodiment similarly to the above third embodiment, when the lot LA is transferred to the lot stocker LS, the reticle RA used in the exposing process of the lot LA by the manufacturing apparatus EQ3 is continuously stored in the reticle stocker RS without being transferred from the reticle stocker RS. Thereafter, when the express lot LB is transferred to the manufacturing apparatus EQ3 from the manufacturing apparatus EQ1, the reticle RB used in the exposing process for the express LB by the manufacturing apparatus EQ3 is transferred from the reticle stocker RS to the reticle port RPOT which the manufacturing apparatus EQ3 has.

Figure 13:
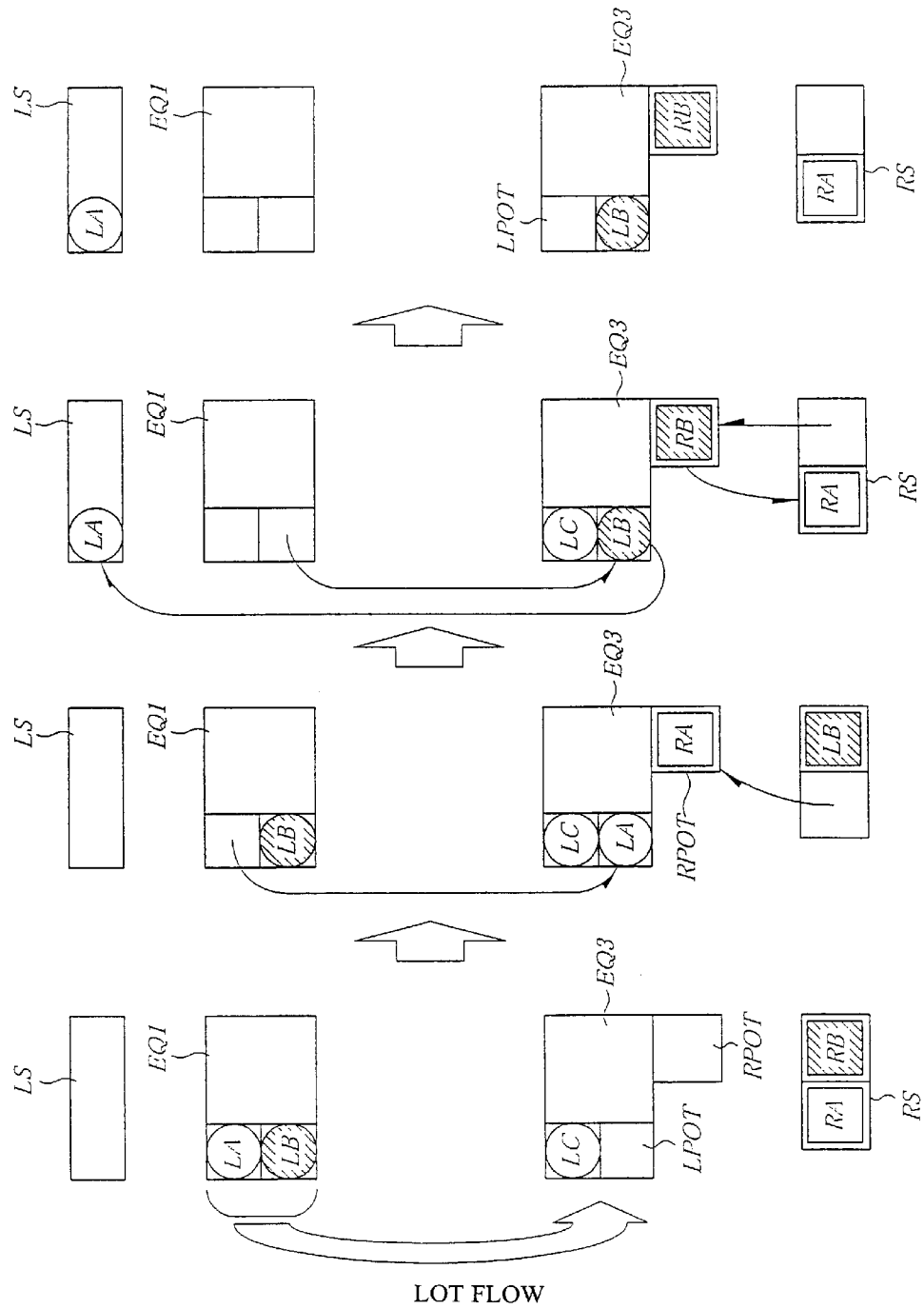
FIG. 13 is an explanatory view illustrating a principal portion of a process for manufacturing a semiconductor device that is a fifth embodiment of the present invention.

FIG. 13 illustrates one example of this fifth embodiment, which corresponds to one shown in FIG. 9 in the above third embodiment. In illustrated in FIG. 13, an arrangement structure of respective manufacturing apparatuses in this fifth embodiment has no manufacturing apparatus EQ2 in comparison with that in the above third embodiment (see FIG. 9), and the process of the express lot LB by the manufacturing apparatus EQ1 is also performed.

As illustrated in FIG. 13, the movements of the lots LA and LC and the express lot LB are the same as those of the lot LA and the express lot LB which are described in the above fourth embodiment with reference to FIG. 11.

Even in this fifth embodiment similarly to the above third embodiment, at the time of the step of transferring the lot LA to the vacant port LPOT in the manufacturing apparatus EQ3, the reticle RA used in the exposing process for the lot LA is transferred from the reticle stocker RS to the reticle port RPOT which the manufacturing apparatus EQ3 has. Then, the process for the express lot LB by the manufacturing apparatus EQ2 is completed before that for the lot LA by the manufacturing apparatus EQ3 starts being performed, and the lot LA having been transferred to the manufacturing apparatus EQ3 is transferred to the lot stocker LS. At the time of the step of the express lot LB is transferred to the vacant port LPOT of the manufacturing apparatus EQ3, which is obtained after the lot LA is transferred, the reticle RA is transferred to the reticle stocker RS from the reticle port RPOT which the manufacturing apparatus EQ3 has, and the reticle RB used in the exposing process for the express lot LB is transferred to the reticle port RPOT from the reticle stocker RS. At this time, immediately after the transfer of the reticle RA to the reticle port RPOT from the reticle stocker RS is completed, the transfer of the reticle RB to the reticle port RPOT from the reticle stocker RS is preferably carried out similarly to the above third embodiment.

The above fifth embodiment can also achieve the same advantages as the above third embodiment. Further, the above fifth embodiment is particularly effective in the case where a remaining processing time period of the lot LA or the express lot LB by the manufacturing apparatus EQ1 becomes shortened or where both remaining processing time periods of the lot LA and the express lot LS become shortened.

As described above, the inventions made by the inventors of the present invention have been concretely described based on the embodiments thereof. However, needless to say, the present invention is not limited to the above embodiments, and can be variously modified and changed without departing from the spirit thereof.

In above embodiments, there has been exemplified the case of applying the present invention to the steps of manufacturing a semiconductor device. However, the present invention can be applied to the manufacturing step of products other than semiconductor devices, for example, magnetic disks, liquid crystal displays, and plasma displays, etc.

The advantages obtained by representative ones among the inventions disclosed in the present application will be brief described as follows.

Namely, if the number of vacant ports of a second manufacturing apparatus used in a next-step is only one at the time when first processes for a second lot by a first processing apparatus is completed, then the second lot is transferred to a lot stocker (first standby area); and the vacant port of the second processing apparatus used in a next-step is secured; and as soon as the first process for a first lot having a high priority, which is being processed in different first processing apparatuses, is completed, the first lot is transferred to the vacant port of the second processing apparatus. Thereby, even if the first processes for the first lot is completed after the first processes for the second lot, the second processes for the first lot prior to the second lot by the second processing apparatus can be performed and so it is possible to reduce the TAT for the first lot having a high priority in the processing.

What is claimed is:

1. A method for manufacturing a semiconductor device, which employs at least one first processing apparatus performing a first process to a lot, and at least one second processing apparatus having two or more than two ports and performing a second process to said lot, the method comprising the steps of:

(a) performing said first process to a first lot with a predetermined process priority by said first processing apparatus;

(b) performing said first process to a second lot lower in process priority than said first lot by said first processing apparatus;

(c) transferring said second lot to a first standby area when said step (b) is completed before said step (a) and only one of said ports is vacant in said second processing apparatus;

(d) transferring said first lot to the vacant port in said second processing apparatus after said step (a); and (e) performing said second process to said first lot by said second processing apparatus.

2. The method for manufacturing a semiconductor device according to claim 1, wherein when another first lot lower in process priority than said first lot and a third lot other than said second lot are transferred to said port in said second processing apparatus at the time of completion of said step (d), said second process for said first lot prior to said third lot is performed.

3. The method for manufacturing a semiconductor device according to claim 1, wherein in the cases where said step (b) is completed before said step (a) and only one of said ports is vacant in said second processing apparatus, when a remaining processing time period of said lot, during which said second processing apparatus performs said second process, is not more than a first set value at the time of completion of said step (b), said second lot is transferred to said vacant port in said second processing apparatus.

4. The method for manufacturing a semiconductor device according to claim 1, wherein said second process is an exposing process, and wherein a first photo mask, in which a predetermined pattern used for the exposing process of said first lot is formed, is transferred to said second processing apparatus in accordance with the transfer of said first lot to said vacant port in said second processing apparatus in said step (d).

5. A method for manufacturing a semiconductor device, which employs at least one first processing apparatus performing a first process to a lot, and at least one second processing apparatus having two or more than two ports and performing a second process to said lot, the method comprising the steps of:

(a) performing said first process to a first lot having a predetermined process priority by said first processing apparatus;

(b) performing said first process to a second lot lower in process priority than said first lot by said first processing apparatus;

(c) transferring said second lot to said ports which are vacant in said second processing apparatus after said step (b);

(d) transferring said second lot to a first standby area from said second processing apparatus and transferring said first lot to said ports vacant in said second processing apparatus when said step (a) is completed during or after said step (c) and when said second process for said second lot by said second processing apparatus stats not being performed; and (e) performing said second process to said first lot by said second processing apparatus.

6. The method for manufacturing a semiconductor device according to claim 5, wherein when another first lot lower in process priority than said first lot and a third lot other than said second lot are transferred to said port in said second processing apparatus at the time of completion of said step (d), said second process for said first lot prior to said third lot is performed.

7. The method for manufacturing a semiconductor device according to claim 5, wherein said second process is an exposing process, and wherein a second photo mask, in which a predetermined pattern used in an exposing process for said second lot is formed, is transferred to said second processing apparatus in accordance with the transfer of said second lot to said ports vacant in said second processing apparatus, in said step (c), and wherein said second photo mask is transferred to a second standby area from said second processing apparatus in accordance with the transfer of said second lot to said first standby area from said second processing apparatus, and a first photo mask, in which a predetermined pattern used in an exposing process for said first lot is formed, is transferred to said second processing apparatus in accordance with the transfer of said first lot to said ports vacant in said second processing apparatus, in said step (d).

8. A method for manufacturing a semiconductor device, which employs at least one first processing apparatus performing a first process to a lot, and at least one second processing apparatus having two or more than two ports and performing a second process to said lot, the method comprising the steps of:

(a) performing said first process to a first lot having a predetermined process priority by said first processing apparatus;

(b) performing said first process to a second lot lower in process priority than said first lot by said first processing apparatus; and (c) performing the second process to the first lot in the second processing apparatus, wherein from among the steps:

(d) transferring said second lot to a standby area when said step (b) is completed before said step (a) and when only one of said ports is vacant in said second processing apparatus;

(e) transferring said first lot to said vacant port in said second processing apparatus after said step (a);

(f) transferring said second lot to said vacant port in said second processing apparatus after said step (b); and (g) transferring said second lot to a standby area from said second processing apparatus and transferring said first lot to said vacant port in said second processing apparatus when said step (a) is completed during or after said step (f) and when said second process for said second lot by said second processing apparatus starts not being performed, either said steps (d) and (e) or said steps (f) and (g) are selectively performed before said step (c) in accordance with an utilization rate of said second processing apparatus.

9. The method for manufacturing a semiconductor device according to claim 8, wherein the utilization rate of said second processing process used in said steps (d) and (e) is relatively higher than that used in said steps (f) and (g).

10. The method for manufacturing a semiconductor device according to claim 8, wherein when another first lot later in process priority than said first lot and a third lot other than said second lot are transferred to said ports in said second processing apparatus at the time of the completion of said step (e) or (g), said second process for said first lot prior to said third lot is performed.

11. The method for manufacturing a semiconductor device according to claim 8, wherein when said steps (b) is completed before said step (a) and only one of said ports is vacant in said second processing apparatus at the time of the completion of said step (b) and a remaining processing time period of said lot, during which said second process apparatus performs said second process, is not more than a first set value at the time of the completion of said step (b) and said steps (d) and (e) are employed, said second lot is transferred to said ports vacant in said second processing apparatus.

12. The method for manufacturing a semiconductor device according to claim 8, wherein in said step (e), said second process is an exposing process; a first photo mask, in which a predetermined patter used in an exposing process for said first lot is formed, is transferred to said second processing apparatus in accordance with the transfer of said first lot to said ports vacant in said second processing apparatus; in said step (f), a second photo mask, in which a predetermined pattern used in an exposing process for said second lot is formed, is transferred to said second processing apparatus in accordance with the transfer of said second lot to said ports vacant in said second processing apparatus; in said step (g), said second photo mask is transferred to a second standby area from said second processing apparatus in accordance with the transfer of said second lot to said first standby area from said second processing apparatus, and a first photo mask, in which a predetermined pattern used in the exposing process of said first lot is formed, is transferred to said second processing apparatus in accordance with the transfer of said first lot to said ports vacant in said second processing apparatus.

13. A method for controlling transfer in a production line employing at least one first processing apparatus performing a first process to a lot, and at least one second processing apparatus having two or more than two ports and performing a second process to said lot, the method comprising the steps of:

(a) performing said first process to a first lot having a predetermined process priority by said first processing apparatus;

(b) performing said first process to a second lot lower in process priority than said first lot by said first processing apparatus;

(c) transferring said second lot to a first standby area when said step (b) is completed before said step (a) and only one of said ports is vacant in said second processing apparatus;

(d) transferring said first lot to said vacant port in said second processing apparatus after said step (a); and (e) performing said second process to said first lot by said second processing apparatus.

14. A semiconductor manufacturing apparatus comprising:

at least one first processing apparatus performing a first process to a lot;

a first standby area provided at a predetermined position;

a second processing apparatus having two or more than two ports and performing a second process to said lot;

a transfer apparatus transferring the lot to said first processing apparatus and said second processing apparatus; and a control means controlling said first processing apparatus, said second processing apparatus and said transfer apparatus, wherein said control means controls said transfer apparatus such that:
  (a) in the presence of at least one vacant port in said second processing apparatus at the time of completing said first process for a first lot having a predetermined process priority by said first processing apparatus, transferring said first lot to said vacant port; and
  (b) in the absence of two or more of said vacant ports in said second processing apparatus at the time of completing said first process to a second lot lower in process priority than said first lot by said first processing apparatus, transferring said second lot to said first standby area.

15. A semiconductor manufacturing apparatus comprising:
  at least one first processing apparatus performing a first process to a lot;
  a first standby area provided at a predetermined position;
  a second processing apparatus having two or more than two ports and performing a second process to said lot;
  a transfer apparatus transferring said lot to said first processing apparatus and said second processing apparatus; and
  a control means controlling said first processing apparatus, said second processing apparatus and said transfer apparatus,
wherein said control means controls said transfer apparatus such that:
  (a) at the time of completing said first process of a second lot lower in process priority than a first lot having a predetermined process priority by the first processing apparatus, said second lot is transferred to the ports vacant in said second processing apparatus; and
  (b) when said first process of said first lot by the first processing apparatus is completed during or after the transfer of said second lot to the ports vacant in said second processing apparatus and when said second process for said second lot by said second processing apparatus starts not being performed, said second lot is transferred to a first standby area from said second processing apparatus and said first lot is transferred to said vacant port in said second processing apparatus.

* * * * *